(12) United States Patent
Inagawa et al.

(10) Patent No.: US 7,879,210 B2
(45) Date of Patent: *Feb. 1, 2011

(54) PARTIALLY SUSPENDED ROLLING MAGNETRON

(75) Inventors: Makoto Inagawa, Palo Alto, CA (US); Akihiro Hosokawa, Cupertino, CA (US); John M. White, Hayward, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1227 days.

This patent is subject to a terminal disclaimer.

(21) Appl. No.: 11/347,667

(22) Filed: Feb. 3, 2006

(65) Prior Publication Data

US 2007/0193881 A1    Aug. 23, 2007

(51) Int. Cl.
C23C 14/35    (2006.01)
(52) U.S. Cl. .................................. 204/298.2
(58) Field of Classification Search .............. 204/298.2, 204/298.19
See application file for complete search history.

(56) References Cited

U.S. PATENT DOCUMENTS

| | | | |
|---|---|---|---|
| 5,022,978 A | 6/1991 | Hensel et al. | |
| 5,518,593 A | 5/1996 | Hosokawa et al. | 204/192.12 |
| 5,565,071 A | 10/1996 | Demaray et al. | 204/192.12 |
| 5,827,409 A | 10/1998 | Iwata et al. | |
| 5,855,744 A | 1/1999 | Halsey et al. | |
| 6,013,159 A * | 1/2000 | Adams et al. | 204/192.12 |
| 6,322,679 B1 * | 11/2001 | De Bosscher et al. | 204/298.2 |
| 6,494,999 B1 | 12/2002 | Herrera et al. | |
| 2001/0009224 A1 | 7/2001 | Han et al. | |
| 2005/0145478 A1 | 7/2005 | Tepman | 204/192.12 |

FOREIGN PATENT DOCUMENTS

| | | | |
|---|---|---|---|
| JP | 59-20469 | * | 2/1984 |
| JP | 59020469 A | | 2/1984 |
| JP | 8-199354 | | 8/1996 |

OTHER PUBLICATIONS

Office Action dated Dec. 8, 2009 for U.S. Appl. No. 11/601,576.
Notice to a File a Response dated Jun. 14, 2010 for Korean Patent Application No. 10-2008-70146.

(Continued)

Primary Examiner—Rodney G McDonald
(74) Attorney, Agent, or Firm—Patterson & Sheridan, LLP

(57) ABSTRACT

A magnetron scanning and support mechanism in which the magnetron is partially supported from an overhead scanning mechanism through multiple springs coupled to different horizontal locations on the magnetron and partially supported from below at multiple locations on the target, on which it slides or rolls. In one embodiment, the yoke plate is continuous and uniform. In another embodiment, the magnetron's magnetic yoke is divided into two flexible yokes, for example, of complementary serpentine shape and each supporting magnets of respective polarity. The yokes separated by a gap sufficiently small that the two yokes are magnetically coupled. Each yoke has its own set of spring supports from above and rolling/sliding supports from below to allow the magnetron shape to conform to that of the target. Alternatively, narrow slots are formed in a unitary yoke.

33 Claims, 13 Drawing Sheets

OTHER PUBLICATIONS

International Search Report and Written Opinion dated Dec. 4, 2007 for International Patent Application No. PCT/US2006/044915.
International Preliminary Report on Patentability dated Apr. 2, 2009 for International Patent Application No. PCT/US2006/044915.
Taiwan Office Action dated Sep. 28, 2010 for Taiwan Patent Application No. 95145056.

* cited by examiner

Summary of the Invention and Background Art text follows.

PARTIALLY SUSPENDED ROLLING MAGNETRON

FIELD OF THE INVENTION

The invention relates generally to sputter deposition in the fabrication of semiconductor integrated circuits. In particular, the invention relates to magnetrons scanned over the back of a sputtering target.

BACKGROUND ART

Plasma magnetron sputtering has been long practiced in the fabrication of silicon integrated circuits. More recently, sputtering has been applied to depositing layers of materials onto large, generally rectangular panels of glass or polymeric sheets. The completed panel may incorporate thin-film transistors, plasma display, field emitter, liquid crystal display (LCD) elements, or organic light emitting diodes (OLEDs) and is typically directed to flat panel displays. Photovoltaic cells may similarly be fabricated. Related technology may be used for coating glass windows with optical layers. The material of the sputter deposited layer may be a metal, such as aluminum or molybdenum, transparent conductors, such as indium tin oxide (ITO), and yet other materials including silicon, metal nitrides and oxides.

Demaray et al. describe such a flat panel sputter reactor in U.S. Pat. No. 5,565,071, incorporated herein by reference in its entirety. Their reactor includes, as illustrated in the schematic cross section of FIG. 1, a rectangularly shaped sputtering pedestal electrode 12, which is typically electrically grounded, for holding a rectangular glass panel 14 or other substrate in opposition to a rectangular sputtering target assembly 16 within a vacuum chamber 18. The target assembly 16, at least the surface of which is composed of a metal to be sputtered, is vacuum sealed to the vacuum chamber 18 across an isolator 20. Typically, a target layer of the material to be sputtered is bonded to a backing plate in which cooling water channels are formed to cool the target assembly 16. A sputtering gas, typically argon, is supplied into the vacuum chamber 18 held at a pressure in the milliTorr range.

Advantageously, a back chamber 22 is vacuum sealed to the back of the target assembly 16 and is vacuum pumped to a low pressure, thereby substantially eliminating the pressure differential across the target 16 and its backing plate. Thereby, the target assembly 16 can be made much thinner. When a negative DC bias is applied to the conductive target assembly 16 with respect to the pedestal electrode 12 or other grounded parts of the chamber such as wall shields, the argon is ionized into a plasma. The positive argon ions are attracted to the target assembly 16 and sputter metal atoms from the target layer. The metal atoms are partially directed to the panel 14 and deposit thereon a layer at least partially composed of the target metal. Metal oxide or nitride may be deposited in a process called reactive sputtering by additionally supplying oxygen or nitrogen into the chamber 18 during sputtering of the metal.

To increase the sputtering rate, a magnetron 24 is conventionally placed in back of the target 16. If it has a central pole of one vertical magnetic polarity surrounded by an outer pole of the opposite polarity to project a magnetic field within the chamber 18 and parallel to the front face of the target 16, under the proper chamber conditions a high-density plasma loop is formed in the processing space adjacent the target layer. Two opposed magnetic poles 26, 28 are separated by a substantially constant gap defining the track of the plasma loop. The magnetic field from the magnetron 24 traps electrons and thereby increases the density of the plasma and as a result increases the sputtering rate of the target 16. The relatively small widths of the linear magnetron 24 and of the gap produces a higher magnetic flux density. The closed shape of the magnetic field distribution along a single closed track prevents the plasma from leaking out the ends.

The size of the rectangular panels being sputter deposited is continuing to increase.

One generation processes a panel having a size of 1.87 m×2.2 m and is called 40K because its total area is greater than 40,000 cm$^2$. A follow-on generation called 50K has a size of greater than 2 m on each side.

These very large sizes have imposed design problems in the magnetron since the target spans a large area and the magnetron is quite heavy but nonetheless the magnetron should be scanned over the entire area of the target and in close proximity to it.

SUMMARY OF THE INVENTION

A magnetron for use in a plasma sputter reactor is partially supported from below on the back of the target on which it can roll or slide and partially supported from above by spring-loaded supports from a scanning mechanism. Thereby, the magnetron may track the shape of a non-flat target as it being scanned across the back of the target.

In one series of embodiments, the sputter chamber includes a gantry or carriage which can move relative in a first direction to the chamber body through, for example, a first set of rollers, and which supports, for example, through a second set of rollers the magnetron for movement in a second direction. The gantry partially supports the magnetron from above through plural spring-loaded supports while rollers or other means partially support the magnetron from below on the target. The springs may be included in the second set of rollers or be included in members coupling trolleys engaging the second set of rollers to the magnetron. For example, the second set of rollers may suspend a support plate which supports the magnetron either through fixed means or spring-loaded means.

In one embodiment, the magnetron itself is flexible so that it may conform to the shape of the target. The magnetron may be is composed of two interleaved yoke plates separated by a gap sufficiently small that the yoke plates are magnetically coupled although structurally decoupled. Each of the yoke plates support magnets of a respective polarity. Each yoke plate is separately spring-supported from above and partially supported on the target by rollers or sliders. Alternatively, thin slots may be formed into a single yoke plate to structurally separate different portions of the yoke plate while they remain magnetically coupled.

DETAILED DESCRIPTION OF THE PREFERRED EMBODIMENTS

Figure 1:
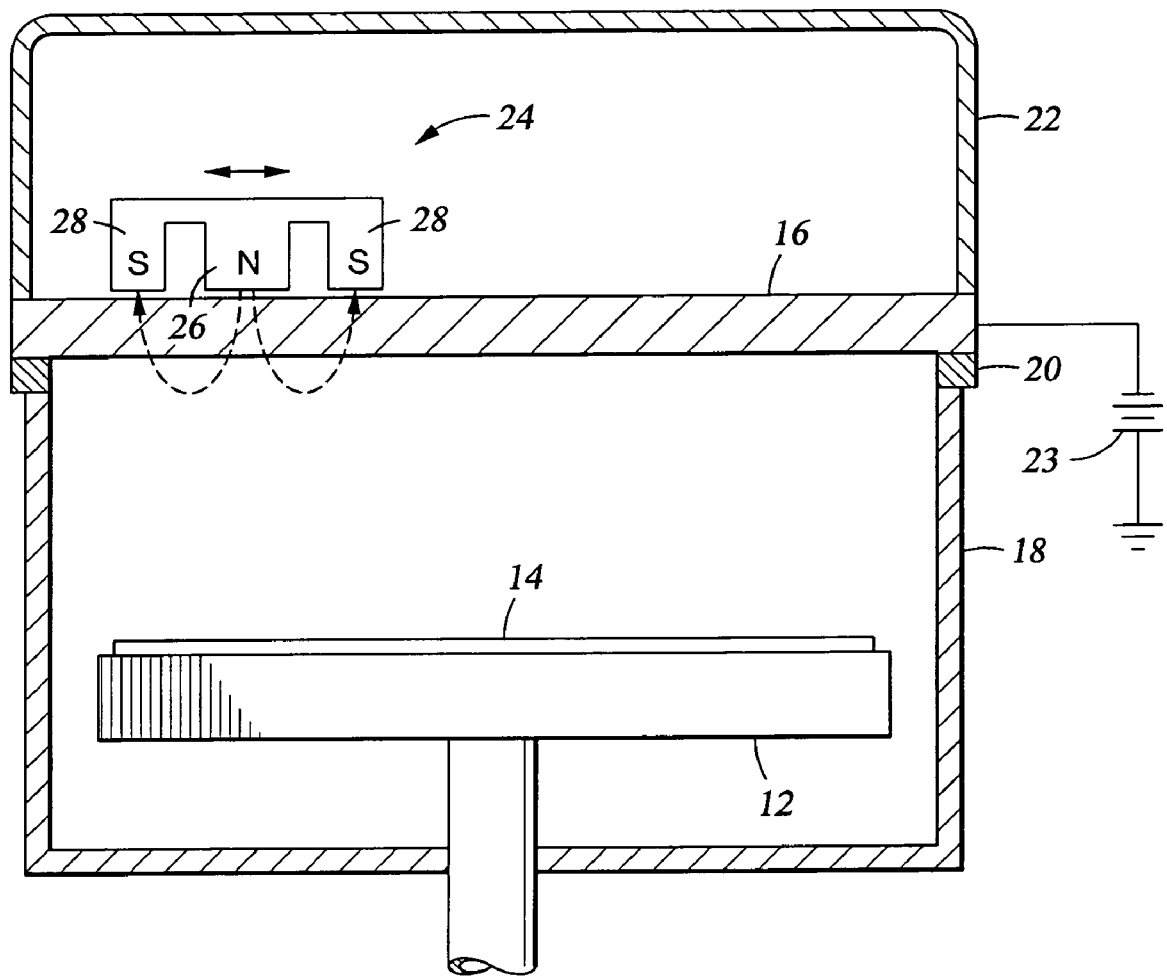
FIG. 1 is a schematic cross-sectional view of a conventional plasma sputtering chamber configured for sputtering onto rectangular panels.

Tepman in U.S. patent application Ser. No. 11/211,141, filed Aug. 24, 2005, incorporated herein by reference, and partially published in U.S. patent application publication 2005/145,478, addresses several of the problems of large magnetrons. Tepman discloses a nearly square magnetron of a size only somewhat less than that of the target in which the magnets are arranged to form a closed plasma loop of convolute shape in the form of either a spiral or folded structure. A scanning mechanism scans the magnetron in a dimensional scan pattern over the remaining area of the target to produce a more uniform sputtering profile.

Tepman describes two types of support structures for the magnetron. In the first type, the target supports the overhead magnetron through Teflon pads which are mounted on the bottom of the magnetron and which can easily slide over the back of the target under the urging of a horizontal pushing or pulling force applied to the magnetron supported on the target. In the second type, the magnetron is suspended from an overhead carriage mounted on the chamber frame in the form of a gantry which can scan the suspended target above the back of the target.

The target-supported magnetron closely tracks the shape of the target, thus reducing the non-uniformity in magnetic field in the plasma region. The gap between the magnetron and the target are closely controlled by the thickness of the pads so that gap can be advantageously minimized. However, the target-support magnetron has the disadvantage that the magnetron including its magnets can be quite heavy, for example, over one ton. The great weight imposes a great force upon the target, which should be relatively thin to allow the magnetic field to penetrate from the magnetron at its top to the processing region at its bottom. As a result, the target is bound to significantly bow under the weight of the magnetron it supports. Excessive bow creates a significant variation in the spacing between the target and the panel being sputter coated, which introduces its own non-uniformity.

The carriage-supported magnetron removes the weight of the magnetron from the target to a scanning mechanism mounted above it, but it has the disadvantage of mechanically decoupling the magnetron from the target. The thin target, even without additional loading, tends to bow. The bow in the shape of the target is often downward under the force of the target's own weight. However, in some circumstances the bow is upwards. The cause of the upward bow is not completely understood but according to one explanation the upward bow arises from the inward force exerted on the clamped target by a vacuum-pumped chamber. Furthermore, as sputtering continues over the lifetime of the target and increasingly erodes the target and decreases its thickness, the bow may change. Any spatial variation in the spacing between the magnetron and the target introduces a non-uniformity in the magnetic field at the front face of the target and hence a non-uniformity in the plasma density and a non-uniformity in the thickness of the film sputter deposited on the panel. For commercial production, the film thickness must be as uniform as possible. The conventional carriage-supported magnetron does not easily provide for adjusting the spacing, particularly variable spacing over the extent of the target.

Figure 2:
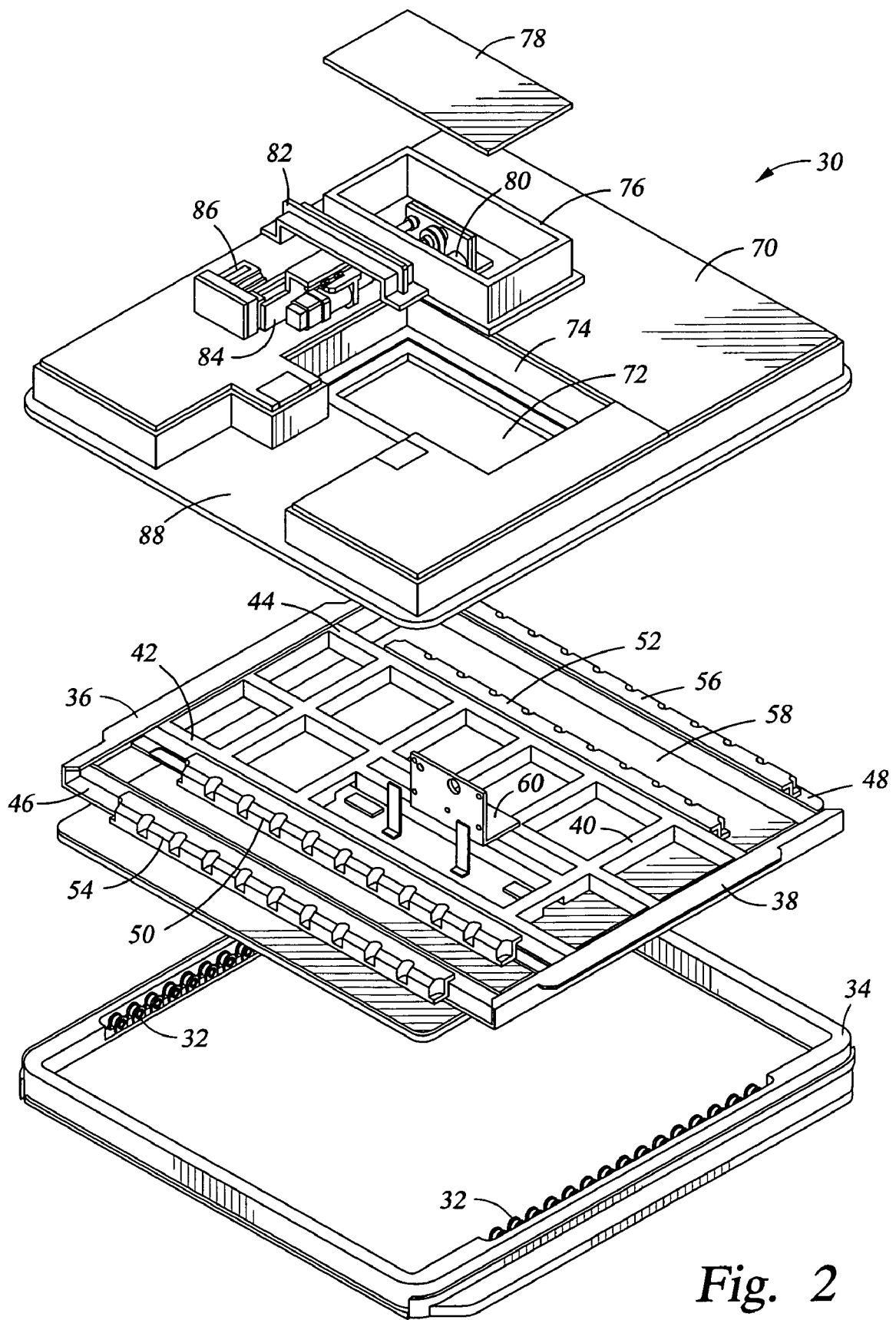
FIG. 2 is an orthographic view of a two-dimensional scanning mechanism usable in the sputtering chamber of FIG. 1.

The invention may be applied to a magnetron scan mechanism assembly 30 illustrated in the exploded orthographic view of FIG. 2. Further details are available in the Tepman patent, from which the present design was derived. Two rows of rollers 32 are supported on opposed sides of a frame 34 constituting the sidewalls of the back chamber 22 of FIG. 1.

The rollers 32 rollably support inverted frame rails 36, 38 supporting a gantry 40 between them. The gantry 40 includes four unillustrated rows of rollers on inner struts 42, 44 and outer struts 46, 48 for rollably supporting inverted gantry inner rails 50, 52 and outer rails 54, 56. The rails partially support a magnetron plate 58 including magnets on its lower side. The outer struts 46, 48 and outer rails 54, 56 provide additional support on the sides of the heavy magnetron plate 58 to reduce the amount of droop near the edges. In the Tepman configuration, the magnetron plate 58 is rigidly fixed to the inner rails 50, 52 so that the gantry 40 completely supports the magnetron plate 58. A base plate 60 is fixed to the frame structure forming the gantry 40.

In one aspect of the present invention, the connection between the gantry 40 and the magnetron plate 58 is more flexible than a rigid mechanical connection so that the gantry 40 only partially supports the magnetron plate 58 and the spacing between the magnetron and the target may be varied. By the rolling motion of the gantry 40 and rails 36, 38, 50, 52, 54, 56, the magnetron plate 58 can be moved in perpendicular directions inside the frame 34.

A magnet chamber roof 70 forming the top wall of the back chamber 22 of FIG. 1, is supported on and sealed to the frame 34 with the gantry structure disposed between them and provides the vacuum wall over the top of the chamber accommodating the magnetron. The magnet chamber roof 70 includes a rectangular aperture 72 and the bottom of a bracket recess 74. A bracket chamber 76 fits within the bracket recess 74 and is sealed to the chamber roof 70 around the rectangular aperture 72. A top plate 78 is sealed to the top of the bracket chamber 76 to complete the vacuum seal.

A gantry bracket 80 movably disposed within the bracket chamber 76 is fixed to the base plate 60 of the gantry 40. A support bracket 82, which is fixed to the exterior of the magnet chamber roof 70, and an intermediate angle iron 84 hold an actuator assembly 86 in an actuator recess 88 in the roof 70 outside the vacuum seal. The support bracket 82 further acts as part of the truss system in the magnet chamber roof 70. The actuator assembly 86 is coupled to the interior of the bracket chamber 76 through two sealed vacuum ports. As explained by Tepman, the actuator assembly 86 independently moves the gantry 40 in one direction by force applied through the gantry bracket 80 fixed to the gantry's base plate 60 and moves the magnetron plate 58 in the perpendicular direction by a belt drive with a belt having its ends fixed to the magnetron plate 58.

According to one aspect of the invention, the magnetron and its magnetron plate 58 are partially supported on the target assembly 16 and partially supported on the gantry 40 (also referred to as a carriage), which is scanning the magnetron over the back of the target 16. The partial support on the target causes the magnetron to follow the bow or other shape of the target, thus reducing the variation of the gap between the magnetron and the target. On the other hand, the partial and usually major support on the carriage removes some and usually most of the weight of the magnetron from the target, thus reducing the downward deflection of the target. Le et al. describe in U.S. patent application Ser. No. 11/282,798, filed Nov. 17, 2005, a scanning mechanism which actively controls the vertical separation between the target and the magnetron, which the gantry suspends above the target. In contrast, a division of support between the target and gantry allows a passive method of tracking of the shape of the target.

Figure 3:
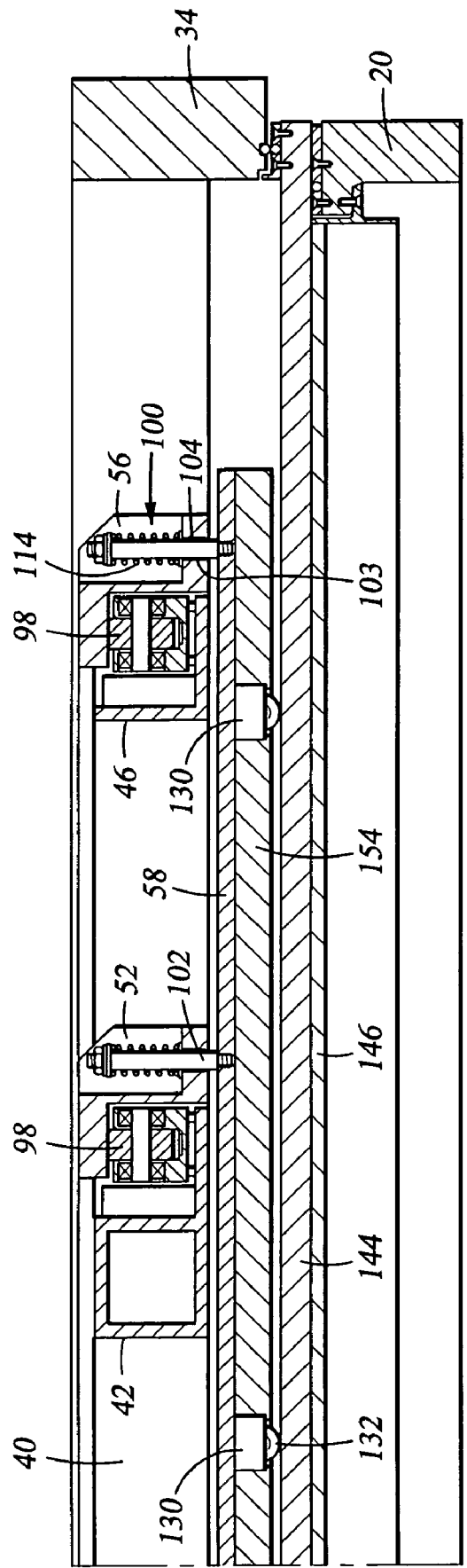
FIG. 3 is a cross-sectional view of a first embodiment of a spring-loaded support.
Figure 4:
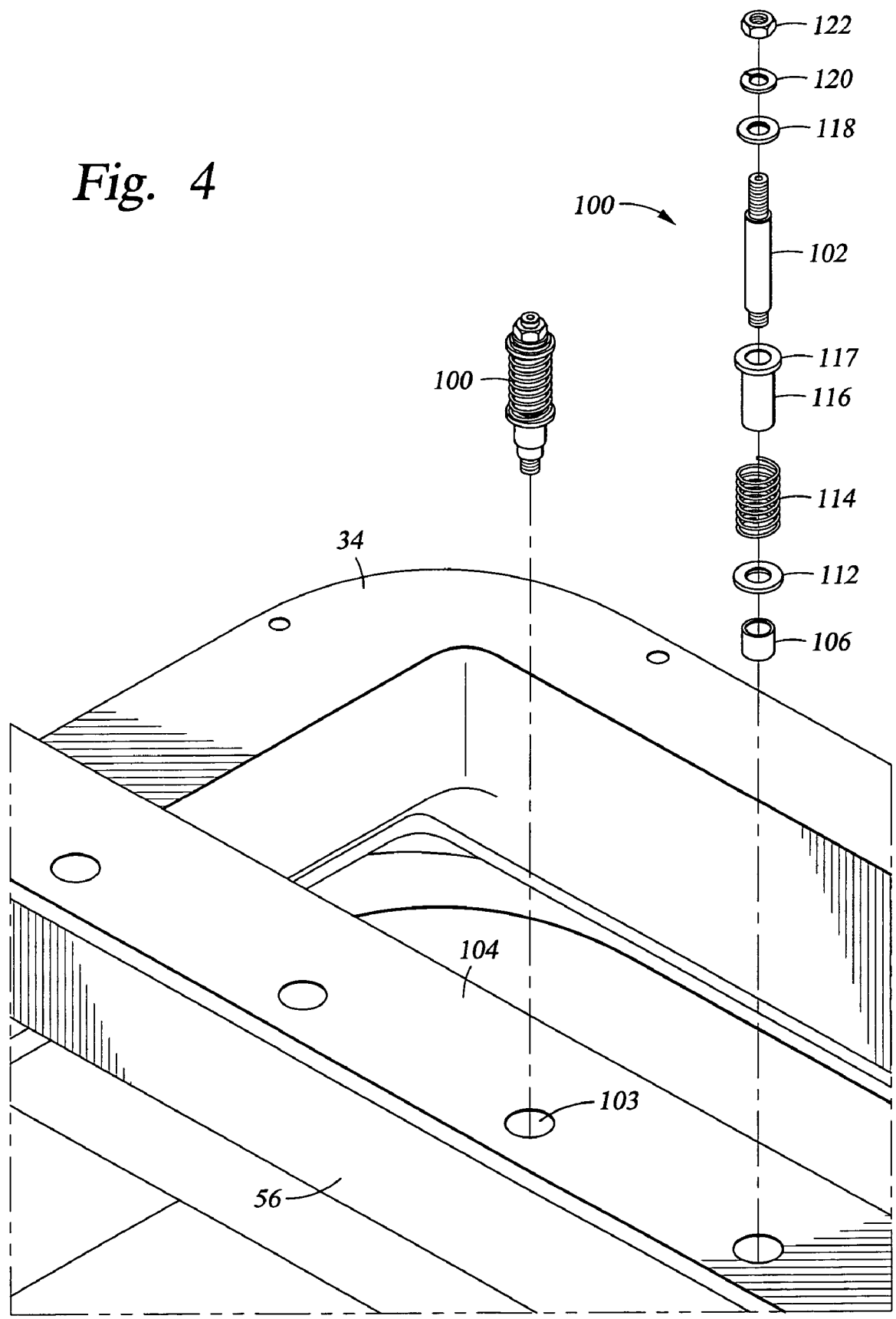
FIG. 4 is an orthographic view, partially exploded, of two of the spring-loaded supports of FIG. 3.

In a first embodiment, illustrated in the cross-sectional view of FIG. 3 and the partial orthographic view of FIG. 4, the magnetron plate 58 is partially supported from above by the vertically fixed rails 52, 56 (a similar structure is applied to the rails 50, 54 on the other side) rolling on cylindrical roller assemblies 98. The partial support if effected through multiple spring-loaded stud assemblies 100. Each stud assembly 100 includes a threaded stud 102 screwed into a tapped hole in the magnetron plate 58. The stud 102 extends through a corresponding hole 103 in a top arm 104 of the corresponding rail, for example, rail 56. The rail hole 103 includes a neck which supports a bushing 106, and the stud 102 passes through the bushing 106 and out the bottom of the hole 103 and is screwed into a threaded hole of the magnetron plate 58. The top of the bushing 106 extending above the arm 104 and supports a washer-shaped spring seat 112, which supports a bottom end of a spring 114. A tubular retainer 116 fits within the spring 114 with an upper flange 117 pressing against the top of the spring 114 over its top. The stud 102 passes through the retainer 116 and is laterally isolated from the spring 114 by the retainer 116. An upper washer 118 contacts the top end of the flange 117, and a lock washer 120 is placed above the upper washer 118. A nut 122 is threaded on the stud 102 threaded onto the magnetron plate 58 and thereby forces the upper washer 118 against the spring 114 thereby compressing it. The amount of spring compression determines the force (weight) borne by the top arm 104 of the rail 56 supporting the spring-loaded stud assembly 100 and the partial weight of the magnetron plate 58 supported by that stud assembly 100. The nuts 122 are not tightened sufficiently to force the magnetron plate 58 against the top arm 104 of the gantry 40. Instead a variable gap remains between them to allow the magnetron 58 to follow the shape of the target.

As shown in FIG. 3, the magnetron plate 58 is additionally partially supported on the target 12 through a plurality of roller ball assemblies 130 mounted on the bottom of the magnetron plate 58. An example of the roller ball assembly 130 is a ball transfer Model NSMS 1/4, available from Ball Transfer Systems of Perryopolis, Pa. and illustrated in the cross-sectional view of FIG. 5. A roller ball 132, preferably composed of a plastic such as nylon and having a relatively large diameter, for example, 1 inch (2.54 cm) protrudes from a housing 134 but is sealed to it by a seal 136. A large number of small bearing balls 138 rotatably support the roller ball 132 against a hemi-spherical surface of the housing 134. A stud 140 fixed to the housing 134 is screwed into a tapped hole at the bottom (upper in the operational orientation) of a recess formed at the bottom of the magnetron plate 58 or its magnet retainers 154 of sufficient diameter and depth to accommodate the housing 134. The depth of the recess determines the extent that the roller ball 132 protrudes below the magnetron, for example, 0.167 inch (4.2 mm).

The bottom of the roller ball 130 contacts the back of the target, specifically, a backing plate 144 of FIG. 3, in which cooling channels are formed and to which is bonded a target layer 146 of the material to be sputtered. The backing plate 144 is supported and sealed to the isolator 20 on top of the chamber wall 18. The protrusion of the roller balls 130 from the magnetron plate 58 determines the gap between the magnetron 58 and the back of the target 144, 146.

Figure 6:
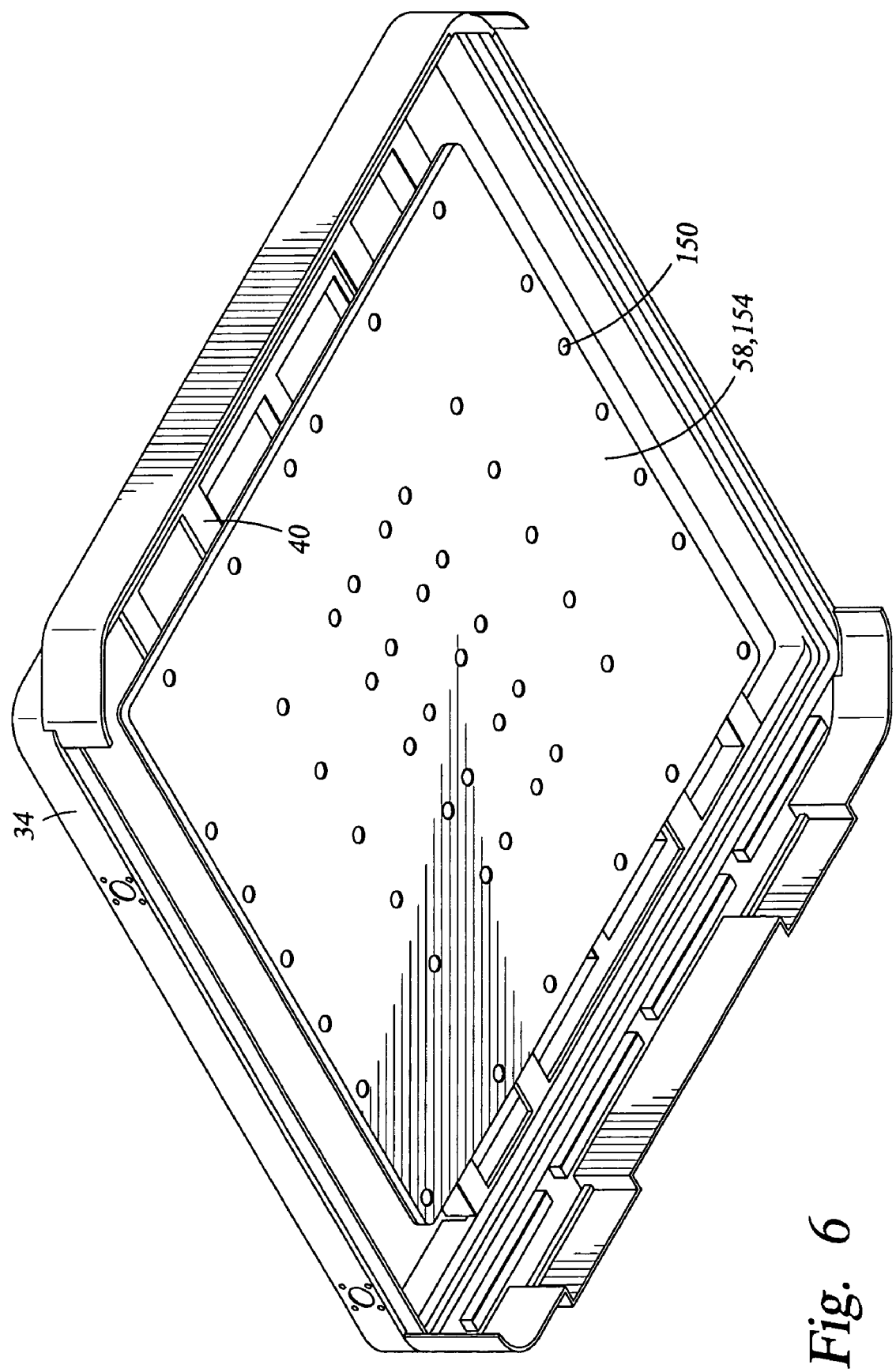
FIG. 6 is an orthographic view of the underside of the gantry and support plate partially supporting the magnetron from above through the spring-loaded supports.

As shown in the orthographic view of FIG. 6, which is an exploded view of FIG. 3, the generally planar bottom of the backing plate 58, which is composed of a magnetic material to act as a magnetic yoke, or its retainer 154 is machined with recesses 150 at its bottom. As shown in the plan view of FIG. 7, each recess 150 is formed as a through hole in the retainer 154 or as a blind hole in the magnetron plate 58 and a central tapped hole 152 is machined into the magnetron plate 58. The ball transfer stud 140 is threaded into the tapped hole 152. A large number of complexly shaped non-magnetic retainers 154, for example, of aluminum, are screwed to the backing plate 144 and have heights generally corresponding to the length of cylindrical magnets which are held between serrated edges of the retainers 154. The recesses 150 for the roller ball assemblies 130 are located on the sides of the retainers 154 away from the magnets. The gap between the magnetron and the target is determined by the amount that the roller ball 132 protrudes beyond the end of the magnets held in the retainers 154.

It has been observed that the rails tend to twist under the load of the supported magnetron. The effect of the twist can be substantially eliminated by replicating the struts in closely spaced pairs with the rail replaced by a T-shaped support having cylindrical roller assemblies at each end of the cross bar supported on respective rails of the pair.

It is appreciated that other types of mechanisms can allow the magnetron plate to glide along the back of the target. Pivoting roller wheels may be substituted the roller balls. Soft pads which do not wear the target may be substituted for the roller balls to allow the magnetron to slide on the back of the target. An example of the soft pads are cut from Teflon sheets and glued to the bottom of the retainers 154.

Figure 8:
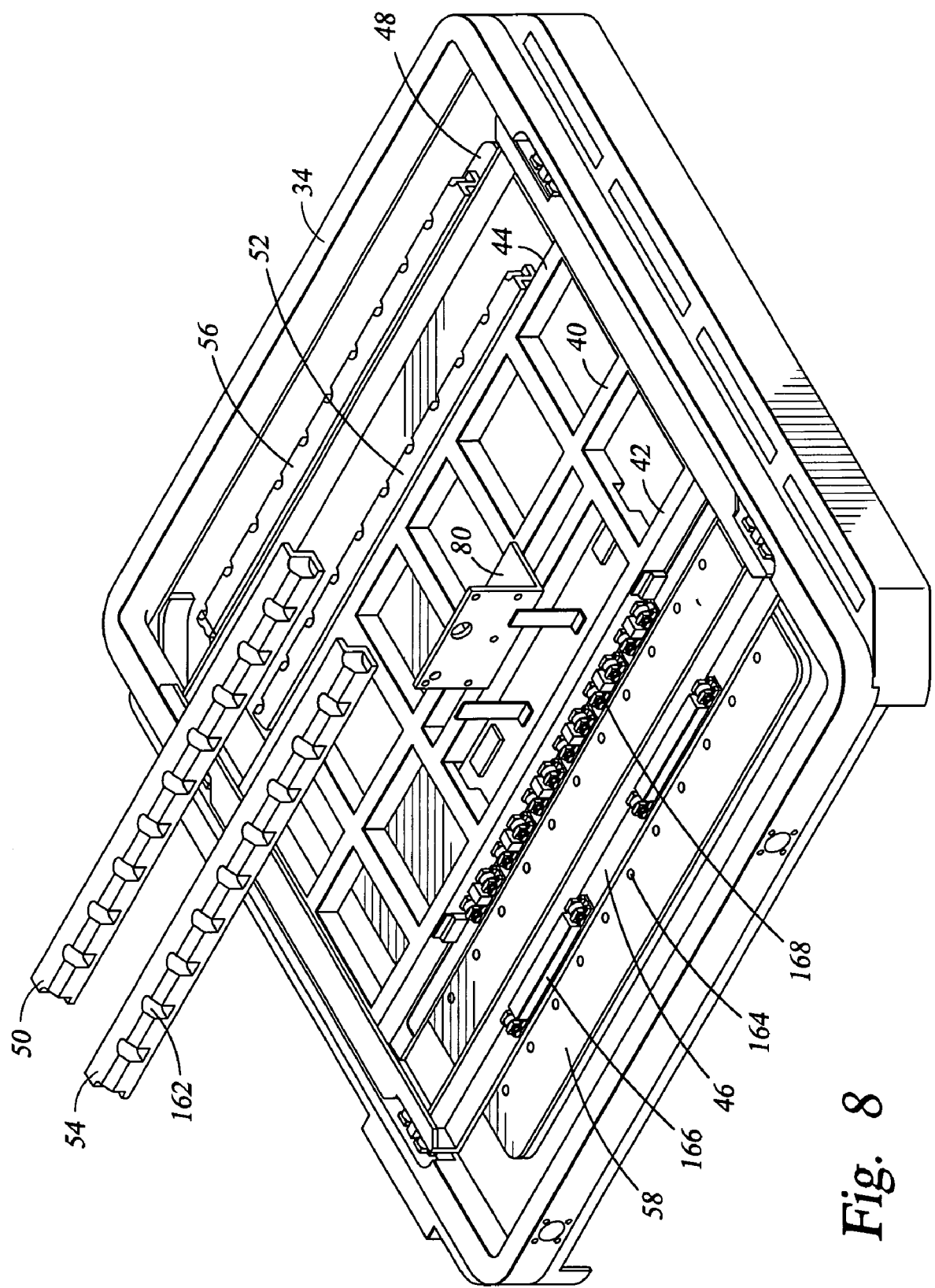
FIG. 8 is an orthographic view of the gantry partially supporting the magnetron in a second embodiment of the invention.
Figure 9:
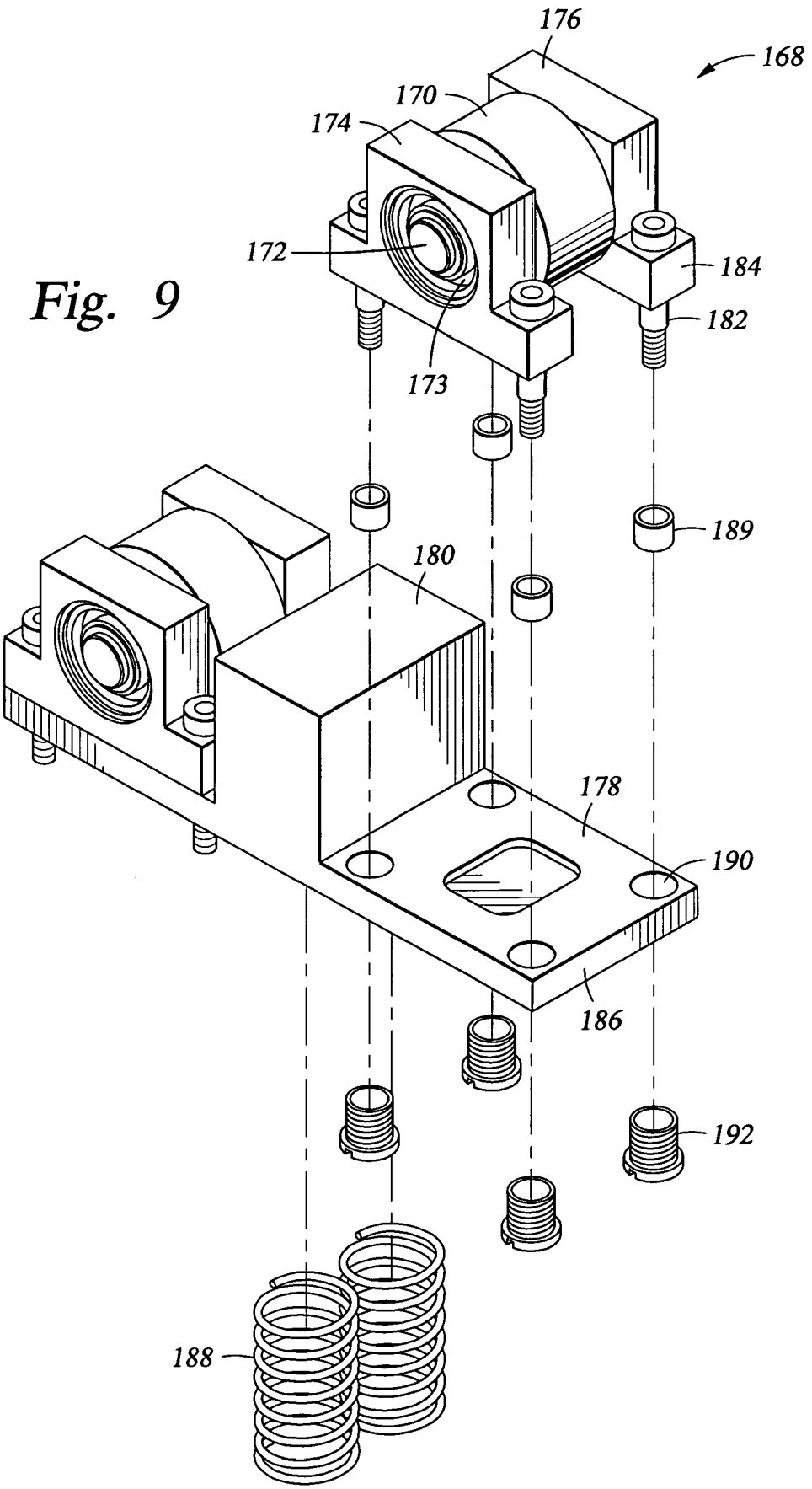
FIG. 9 is an exploded isometric view of a spring-loaded roller assembly supported on the gantry of FIG. 8.
Figure 10:
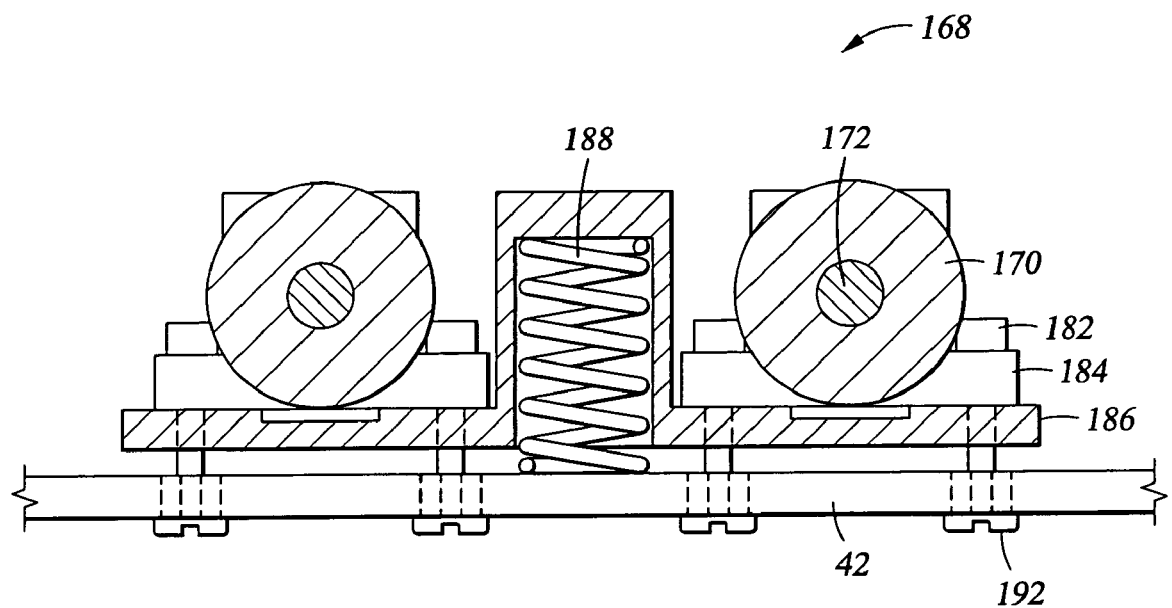
FIG. 10 is a cross-sectional view of the roller assembly of FIG. 9.

A second embodiment of a spring-loaded support places the spring loading between the cylindrical rollers and the rails as illustrated in the orthographic views of FIGS. 8 and 9 and the cross-sectional view of FIG. 10. In this embodiment, the rails 46, 50, 52, 56 are fixed to the magnetron plate 48 by screws passing through pass holes formed at the bottom of cutouts 162 in the rails 50, 52, 54, 56 and threaded into tap holes 164 tapped into the top of the magnetron plate 58. However, spring-loaded roller assemblies 166, 168 are spring-loaded on top of the struts 42, 44, 46, 48. Although the roller assemblies 166 on the outer struts 46, 48 have a different configuration though the same function as the roller assemblies 168 on the inner struts 42, 44, the difference arises from a desire to implement the invention on a pre-existing gantry 40. Alternatively, all roller assemblies 166, 168 may have a same form and structure. The roller assemblies 166, 168 rollably support the rails 50, 52, 54, 56 and its suspended magnetron plate 58 to allow the magnetron plate 58 to roll along the direction of the rails.

As better shown in FIGS. 9 and 10, each roller assembly 168 includes two cylindrical rollers 170 having respective shafts 172 freely rotating in bearings 173 mounted in opposed bearing housings 174, 176. In the prior embodiment as well as in the Tepman configuration, the bearing housings 174, 176 were fixed with screws to the struts. However, in this embodiment, the bearing housings 174, 176 and hence the cylindrical rollers 170 are mounted in pairs within a T-shaped spring housing 178 having a central spring chamber 180 between two bottom portions of a base 186. The spring chamber 180 accommodates two springs 188. Corresponding spring chambers in the roller assemblies 168 accommodate six springs 188. Shoulder screws 182 have heads engaged above tabs 184 in the bearing housings 174, 176 and have shafts passing through holes in the tabs 184 and in the base 186 of the spring housing inside of bushings 189 in through holes 190 in the base 186. The shoulder screws 182 have threaded ends which are threaded into internally and externally threaded inserts 192 threaded into and held in the strut.

Tightening of the shoulder screws 182 compresses the springs 188 between the strut and the top of the spring chamber 180. However, the tightening is not completed to the extent that the base 186 is forced against the strut. Instead, the base 186 and the entire spring assembly 168 is allowed to float above the strut with a gap determined by the torque applied to the shoulder screws 182 and the weight of the partially supported magnetron. The spring torque thus determines in part the fraction of the magnetron weight supported by the gantry. The gap may vary as the magnetron follows the shape of the target. As a result, the split of magnetron weight between the target and the gantry depends on the local height of the target.

Figure 5:
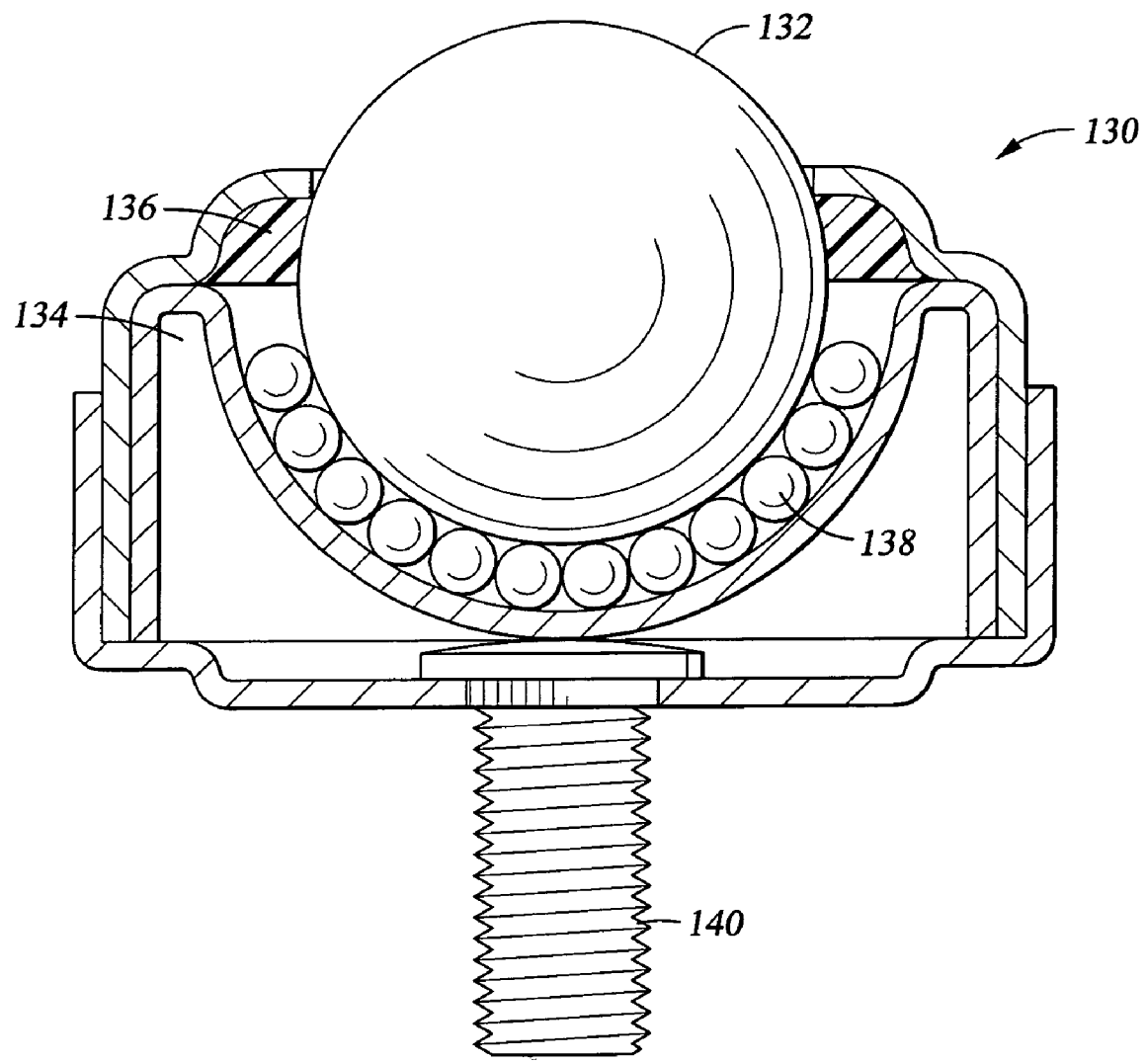
FIG. 5 is a cross-sectional view of ball transfer usable to partially support the magnetron on the back of the target.
Figure 7:
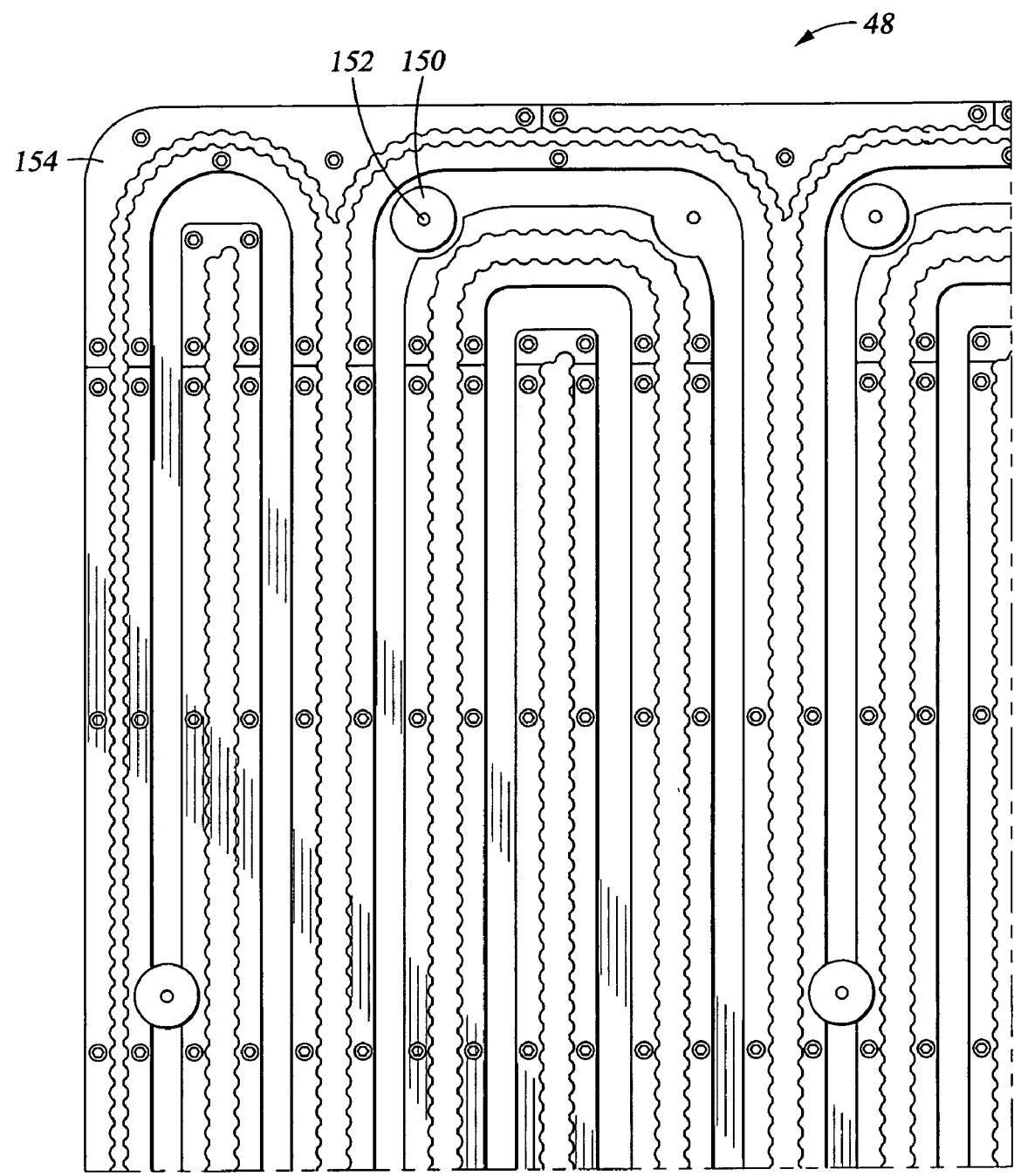
FIG. 7 is a plan view of the retainers used to align magnets on the yoke plate.

In the embodiment of FIGS. 8, 9, and 10, the magnetron plate may be partially supported on the target by roller ball mechanism described with reference to FIGS. 5, 6, and 7 or by other rolling, sliding, or gliding mechanisms, thus dividing the magnetron weight between the gantry and the target.

Other spring-loaded suspension mechanisms may be used to partially support the magnetron from a horizontally movable carriage. For example, cylindrical rollers may be coupled to the bottom of the rails by partially compressed springs and roll on the struts.

The division of support for the magnetron between the gantry and the target allows the heavy magnetron to follow the shape of the target as it is being scanned across the back without unduly flexing the thin target. The gantry should support at least 50% of the weight of the magnetron. Preferably, the target supports less than 25% of the weight and more preferably less than 15%. The multiple independent spring-loaded supports allows the magnetron to not only move vertically but also to tilt if the portion of the target it is tracking is sloping.

Figure 11:
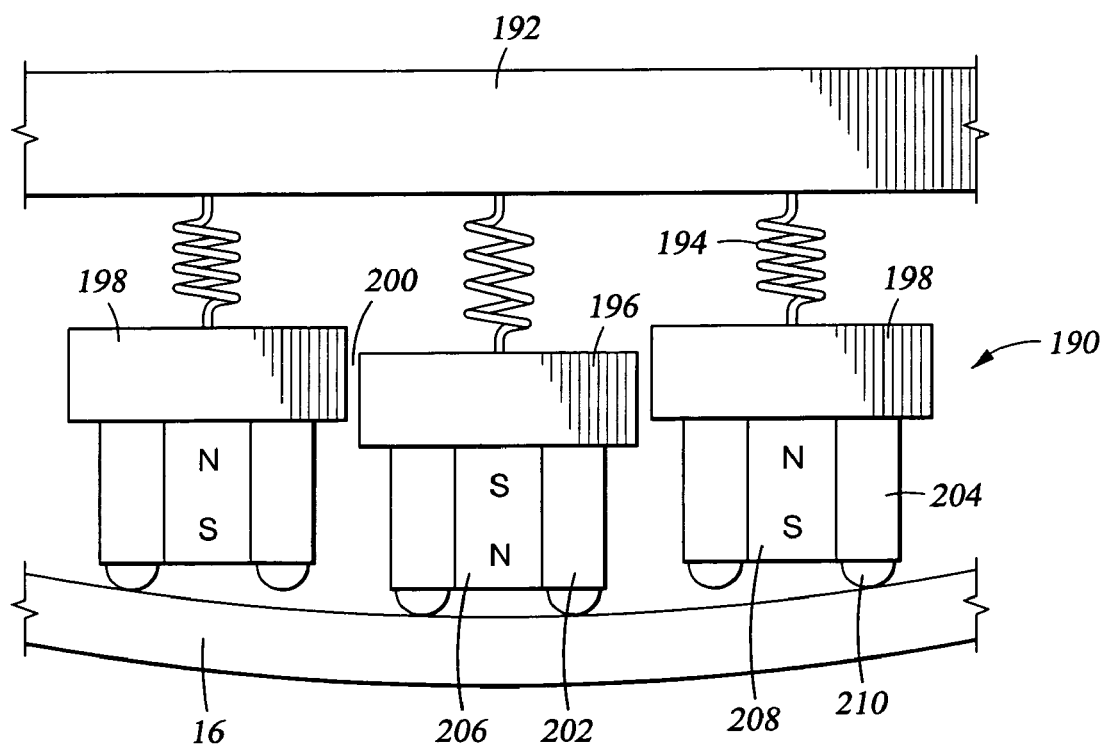
FIG. 11 is a schematic cross-sectional view of a third embodiment of the invention including a flexible magnetron.

Another embodiment, very schematically illustrated in the cross-sectional view of FIG. 11 provides a flexible magnetron 190 which can follow and conform to a sloping shape of the target 16. A support plate 192 partially supports through springs 194 a patterned first magnetic yoke plate 196 and a patterned second magnetic yoke plate 198 interleaved with the first yoke plate 196. The two yoke plates 196, 198, each composed of a magnetizable material, such as magnetically soft steel or stainless steel, are separated by a sufficiently small gap 200 that the two yoke plates 196, 198 form a single magnetic yoke. For example, the gap 200 may be ⅛" (3.2 mm) and is preferably no more than 6.4 mm. The two yoke plates 196, 198 support retainers 202, 204 for aligning anti-parallel magnets 206, 208, which are held by their magnetic field to the respective yoke plates 196, 198. The first yoke plate 196 and its retainers 202 and magnets 206 form a first magnetic pole of the magnetron 190 and the second yoke plate 198 and its retainers 204 and magnets 208 form an opposed second magnetic pole. Roller balls 210 rotate on the bottoms of the retainers 202, 204 and, depending upon the local slope of the target 16, some or all of the roller balls 210 engage and roll on the target 16. As a result, each local part of the magnetron is separately partially supported from above by one of the springs 194 and from below by one or two of the roller balls 210. In the direction perpendicular to the illustration, the yoke plates 196, 198 are generally continuous but are still fairly flexible so that multiple springs 194 and roller balls 210 positioned along the yoke plates 196, 198 allow to bend and conform to the local shape of the target.

Figure 12:
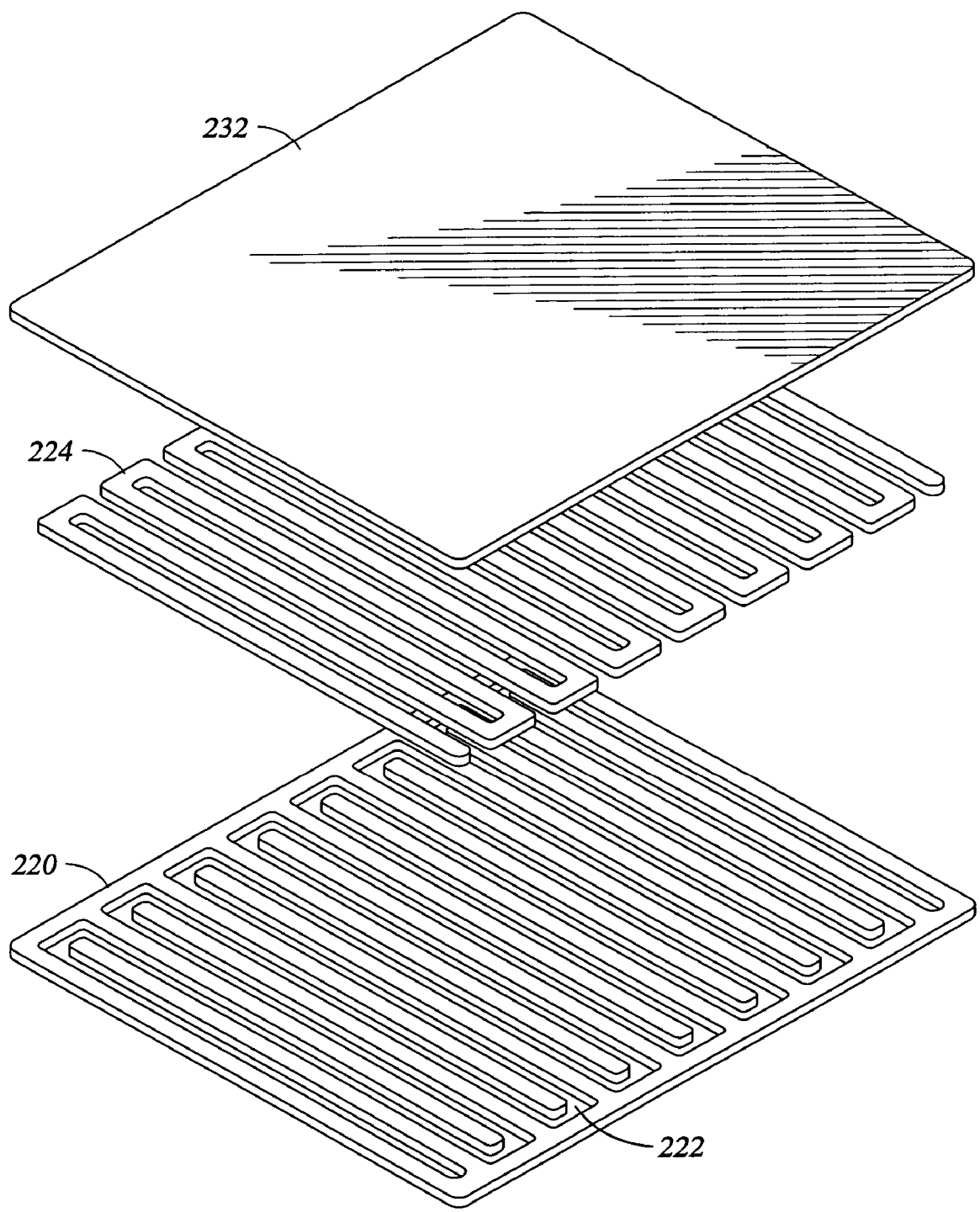
FIG. 12 is an orthographic view of interleaved yoke plates and the support plate in the third embodiment.
Figure 13:
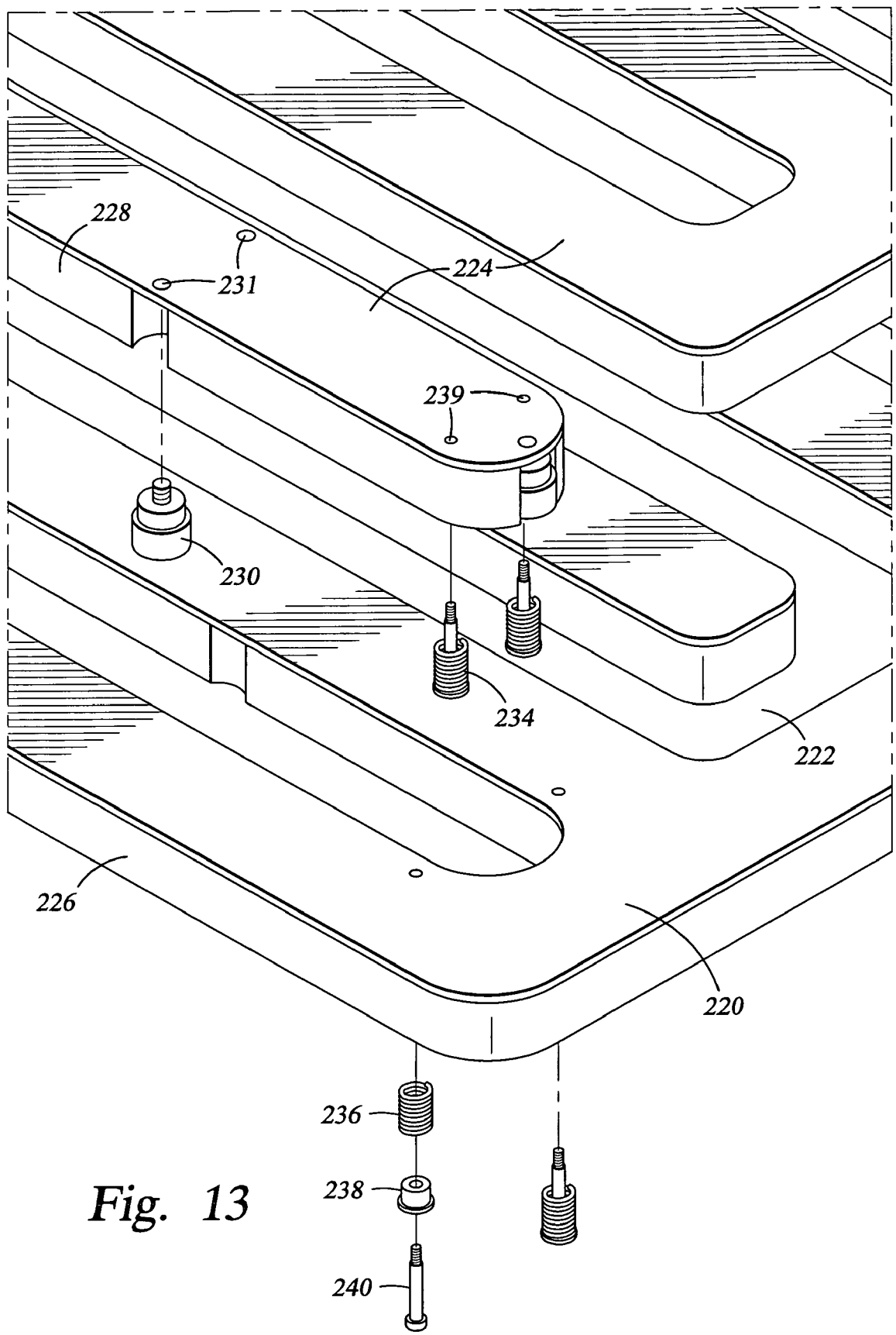
FIG. 13 is an exploded orthographic view of part of FIG. 12.

The magnetron system is more specifically illustrated in the orthographic view of FIG. 12 and the exploded orthographic view of FIG. 13. A patterned outer yoke plate 220 has a continuous outer periphery but a serpentine slot 222. A patterned inner yoke plate 224 has a long serpentine shape that fits within the slot 222 with the predetermined gap 200 between them. The illustrated serpentine shapes are folded. Other serpentine shapes include a rectangularized spiral.

Retainers 226, 228 are screwed on the two yoke plates 220, 224 to align unillustrated magnets. Transfer ball assemblies 230 are fixed to the bottoms of the two yoke plates 220, 224 by being threaded into tapped holes 231 in the yoke plates 220, 224 and have roller balls protruding beyond the retainers 226, 228 to roll on the back side of the target. The yoke plates 220, 224 are partially suspended from a support plate 232. Spring assemblies 234 spring couple the support plate 232 and the yoke plates 220, 224. Each spring assembly 234 includes a spring 236 positioned beneath the respective yoke plate 220, 224, a spring retainer cap 238 at the bottom of the spring 236, and a screw 240 having a screw head engaging the bottom of the spring retainer cap 238, a screw body passing through the spring 238 and a pass hole 239 in the yoke plate 220, 224, and a threaded screw end threaded into the support plate 232 so as to partially suspend the magnetron from the support plate 232 through the springs 236. An exemplary spring strength is 7.4 lb/in (1.7 Nt/cm). The support plate 232 in turn may be supported on and fixed to the gantry configured to scan in two dimensions, as has been described with reference to FIG. 2. Although a solid support plate 232 is illustrated, it may be divided into slats, each supported on the gantry.

The patterned yoke plates 220, 224 have central portions that are relatively flexible so that they can deform to follow the shape of the target on which they are partially supported. That is, the magnetron as a whole is deformable in two dimensions and can conform to the local shape of the target. Furthermore, the desired flexibility allows the magnetron structure as a whole to be relatively lightweight since rigidity is no longer a desired design goal. Since the support plate 232 may be somewhat flexible, it may be composed of aluminum having a thickness of ½" (12.7 mm). The yoke plates 220, 224 do not need to contribute much structural strength and may be formed from magnetically soft steel plates having a thickness of ⅜" (9.5 mm) so that the gap 200 is less than 70% of the thickness of the yoke plates 226, 228 structurally separated by it but magnetically coupled across it. The retainers 226, 228 should be designed to be both lightweight and relatively flexible. Overall, the weight of the magnetron assembly of FIGS. 12 and 13 suspended from the gantry is significantly reduced, for example, by 10%, from that of a magnetron assembly based upon a rigid and solid yoke plate also acting as a support plate.

Figure 14:
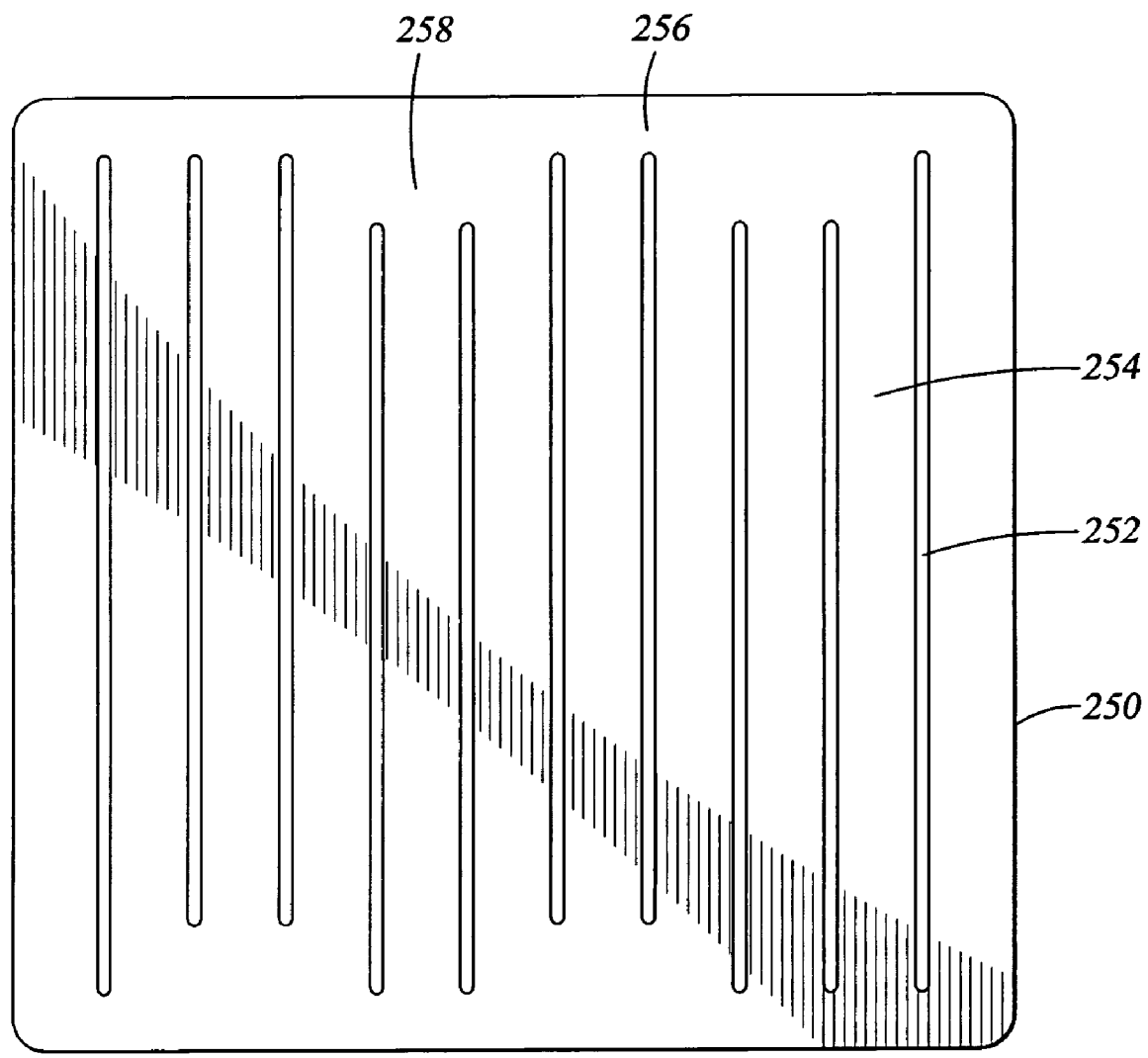
FIG. 14 is a plan view of a yoke plate having narrow parallel slots allowing the plate to flex.

A similar flexibility can be achieved with a unitary patterned yoke plate 250 illustrated in the plan view of FIG. 14 having parallel slots 252 extending nearly but not completely across the plate 250. Aisles 254 between the slots 252 and the uninterrupted peripheral region 256 support the retainers and the magnets of constituting the two opposed poles. Wider peripheral regions 258 support both poles, between which the plasma track is formed. The slots 252 are narrow enough to magnetically couple adjacent aisles but still allow the aisles 254 cantilevered between two parts of the peripheral region 256 to more easily flex. The springs assemblies 234 and transfer ball assemblies 230 of FIG. 13 may be similarly attached to the unitary yoke plate 250.

Although the springs described in the above embodiment are all spiral compression springs, other forms of springs may be used including tension springs and leaf springs.

The invention thus allows closer tracking of the magnetron with a thin non-planar target and a reduction in the weight of the magnetron assembly being scanned, both features becoming increasingly important for sputter chambers designed for the larger flat panels being planned.

The invention claimed is:

1. A magnetron assembly, comprising:
  at least one yoke plate comprising a magnetizable material and configured to support and magnetically couple a plurality of magnets forming a magnetron scannable along a first direction adjacent a sputtering target;
  a plurality of contacts affixed to a first principal side of the at least one yoke plate and movably contactable with a backside of the sputtering target to allow motion of the at least one yoke plate along the first direction while the at least one yoke plate is partially supported on the sputtering target; and
  a plurality of spring supports extending from a second principal side of the at least one yoke plate.

2. The magnetron assembly of claim 1, wherein the contacts comprise rolling balls.

3. The magnetron assembly of claim 1, wherein the contacts comprise pads slidable along the backside of the sputtering target.

4. The assembly of claim 1, further comprising a gantry movable in the first direction and partially supporting the at least one yoke plate through the spring supports.

5. The assembly of claim 4, wherein the spring supports include springs engaged on first ends to a rail rolling on rollers supported on the gantry and second ends to a member fixed to the at least one yoke plate.

6. The assembly of claim 4, wherein the spring supports include springs having first ends engaging the gantry and second ends supporting rollers supporting a rail fixed to the at least one yoke plate.

7. The assembly of claim 1, wherein the at least one yoke plate includes a patterned first yoke plate and a patterned second yoke plate surrounding the first yoke plate and separated therefrom by a predetermined gap, each of the yoke plates comprising plural ones of the spring supports.

8. The assembly of claim 7, wherein the gap is less than 70% of a thickness of the first and second yoke plates.

9. The assembly of claim 1, wherein the at least one yoke plate includes a slotted yoke plate including slots extending substantially across the slotted yoke plate.

10. The assembly of claim 9, wherein aisles formed between the slots support magnets and each of the aisles includes at least one of the spring supports and one of the contacts.

11. The assembly of claim 9, wherein a width of the slots is less than 70% of a thickness of the slotted yoke plate.

12. The assembly of claim 1, wherein the at least one yoke plate includes gaps between portions thereof separating plate portions supporting opposed magnetic poles, a width the gaps being narrow enough to couple magnetic field thereacross.

13. The assembly of claim 12, wherein the width of the gaps is less than 70% of a thickness of the at least one yoke plate.

14. The assembly of claim 1, further comprising a scanning mechanism partially supporting the at least one yoke plate through the spring-loaded supports and capable of scanning the at least one yoke plate in a two-dimensional pattern.

15. The assembly of claim 14, wherein the two-dimensional pattern extends over a generally rectangular area of at least 2 m on each side thereof.

16. The assembly of claim 14, wherein the scanning mechanism supports at least 50% of a weight of the at least one yoke plate and components fixed thereto including the magnets.

17. The assembly of claim 16, wherein the scanning mechanism supports at least 75% of the weight.

18. The assembly of claim 17, wherein the scanning mechanism supports at least 85% of the weight.

19. A plasma sputter chamber, comprising:
  a vacuum chamber including a support for a substrate and configured to be sealed to a target and comprising a material on a first side thereof to be sputter coated on the substrate;
  a scanning mechanism supported on the vacuum chamber disposed on a second side of the target opposite the substrate for scanning in a two-dimensional pattern;
  a magnetron comprising a plurality of magnets;
  a plurality of springs coupling the magnetron to the scanning mechanism to partially support the magnetron; and
  a plurality of movable contacts on a bottom of the magnetron capable of partially supporting the magnetron on the second side of the target.

20. The sputter chamber of claim 19, wherein the movable contacts comprise rotatable balls rotatably supported in the magnetron and rollable on the second side of the target.

21. The sputter chamber of claim 19, wherein the scanning mechanism comprises rollers supported by the springs.

22. The sputter chamber of claim 19, wherein the magnetron includes at least one magnetic yoke plate to which first ends of the springs are fixedly connected.

23. A magnetron assembly, comprising:
  a plurality of first magnets of a first magnetic polarity;
  a plurality of second magnets of a second magnetic polarity opposite the first magnetic polarity; and
  at least one flexible magnetron plate supporting the first and second magnets and magnetically coupling them and passively conformable to a non-planar target assembly including a sputtering target during a movement of the at least one flexible magnetron plate along the target assembly.

24. The assembly of claim 23, wherein the at least one magnetron plate comprises:
  a first magnetron plate supporting the first magnets; and
  a second magnetron plate supporting the second magnets;
  wherein a gap is formed between the first and second magnetron plates.

25. The assembly of claim 24, wherein the gap is no more than 6.4 mm.

26. The assembly of claim 24, wherein the first and second magnetron plates are each respectively at least partially movably supportable on a back side of a target assembly.

27. The assembly of claim 23, wherein the at least one magnetron plate comprises a first magnetron plate having slots formed between portions supporting respectively the first and second magnets.

28. The assembly of claim 27, wherein the slot has a width of no more than 6.4 mm.

29. The assembly of claim 27, wherein the portions are each respectively horizontally movable and at least partially vertically supportable on a back side of the target assembly.

30. A magnetron assembly, comprising:
   a magnetron including a plurality of magnets and scannable along a first direction adjacent a sputtering target assembly; and
   a plurality of rollers rotatably mounted on a first principal side of the magnetron and configured to roll on a back side of the sputtering target assembly to allow motion of the magnetron along the first direction so that the sputtering target assembly at least partially supports the magnetron, wherein the rollers comprise roller balls to allow two-dimensional motion of the magnetron on the back side of the sputtering target.

31. The magnetron assembly of claim 30, wherein the roller balls completely support the magnetron on the sputtering target assembly.

32. A magnetron assembly, comprising:
   a magnetron including a plurality of magnets and scannable along a first direction adjacent a sputtering target assembly; and
   a plurality of rollers rotatably mounted on a first principal side of the magnetron and configured to roll on a back side of the sputtering target assembly to allow motion of the magnetron along the first direction so that the sputtering target assembly at least partially supports the magnetron, wherein the magnetron is flexible and conforms to a shape of the target assembly as the rollers roll on the back side of the sputtering target assembly.

33. The magnetron assembly of claim 32, wherein the rollers comprise roller balls allowing two-dimensional rolling motion of the magnetron on the back side of the sputtering target assembly.

* * * * *

UNITED STATES PATENT AND TRADEMARK OFFICE
CERTIFICATE OF CORRECTION

| | | |
|---|---|---|
| PATENT NO. | : 7,879,210 B2 | Page 1 of 1 |
| APPLICATION NO. | : 11/347667 | |
| DATED | : February 1, 2011 | |
| INVENTOR(S) | : Inagawa et al. | |

It is certified that error appears in the above-identified patent and that said Letters Patent is hereby corrected as shown below:

In the References Cited (56):

Please delete "Notice to a File a Response dated Jun. 14, 2010 for Korean Patent Application No. 10-2008-70146." and insert --Notice to File a Response dated Jun. 14, 2010 for Korean Patent Application No. 10-2008-7014682.-- therefor.

Signed and Sealed this
Twenty-sixth Day of April, 2011

David J. Kappos
*Director of the United States Patent and Trademark Office*